United States Patent
Aquil et al.

(10) Patent No.: US 9,734,890 B1
(45) Date of Patent: Aug. 15, 2017

(54) SYSTEMS AND METHODS FOR INDIVIDUALLY CONFIGURING DYNAMIC RANDOM ACCESS MEMORIES SHARING A COMMON COMMAND ACCESS BUS

(71) Applicant: QUALCOMM INCORPORATED, San Diego, CA (US)

(72) Inventors: Farrukh Aquil, San Diego, CA (US); Michael Drop, La Mesa, CA (US); Vaishnav Srinivas, San Diego, CA (US); Philip Clovis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/142,306

(22) Filed: Apr. 29, 2016

Related U.S. Application Data

(60) Provisional application No. 62/295,236, filed on Feb. 15, 2016.

(51) Int. Cl.
  *G11C 11/409* (2006.01)
  *G11C 11/408* (2006.01)
  *G11C 11/4093* (2006.01)
  *G11C 11/4096* (2006.01)

(52) U.S. Cl.
  CPC ...... *G11C 11/4093* (2013.01); *G11C 11/4082* (2013.01); *G11C 11/4087* (2013.01); *G11C 11/4096* (2013.01)

(58) Field of Classification Search
  CPC ............ G11C 11/4093; G11C 11/4082; G11C 11/4087; G11C 11/4096
  See application file for complete search history.

(56) References Cited

U.S. PATENT DOCUMENTS

| | | | |
|---|---|---|---|
| 6,895,474 B2 | 5/2005 | Ryan et al. | |
| 7,102,958 B2 * | 9/2006 | Lee | G11C 5/00 365/189.12 |
| 7,277,356 B2 | 10/2007 | Lee et al. | |
| 7,405,992 B2 | 7/2008 | Oh | |
| 8,458,415 B2 | 6/2013 | Qawami et al. | |
| 8,737,153 B2 | 5/2014 | Lim et al. | |
| 9,171,585 B2 | 10/2015 | Rajan et al. | |
| 9,183,910 B2 | 11/2015 | Lee et al. | |
| 9,280,454 B1 * | 3/2016 | Elsasser | G06F 12/00 |
| 2013/0100755 A1 | 4/2013 | Youn et al. | |
| 2016/0179377 A1 * | 6/2016 | Yoon | G06F 3/061 711/154 |

* cited by examiner

*Primary Examiner* — Tri Hoang
(74) *Attorney, Agent, or Firm* — Smith Tempel Blaha LLC/Qualcomm

(57) ABSTRACT

Systems and methods are disclosed for configuring dynamic random access memory (DRAM) in a personal computing device (PCD). An exemplary method includes providing a shared command access (CA) bus in communication with a first DRAM and a second DRAM. A first command from a system on a chip (SoC) is received at the first DRAM and the second DRAM. A decoder of the first DRAM determines whether to mask a mode register write (MRW) in response to the received first command. A second command containing configuration information is received vie the shared CA bus at the first DRAM and the second DRAM. Responsive to the determination by the decoder of the first DRAM, the received MRW is either ignored or implemented by the first DRAM.

30 Claims, 10 Drawing Sheets

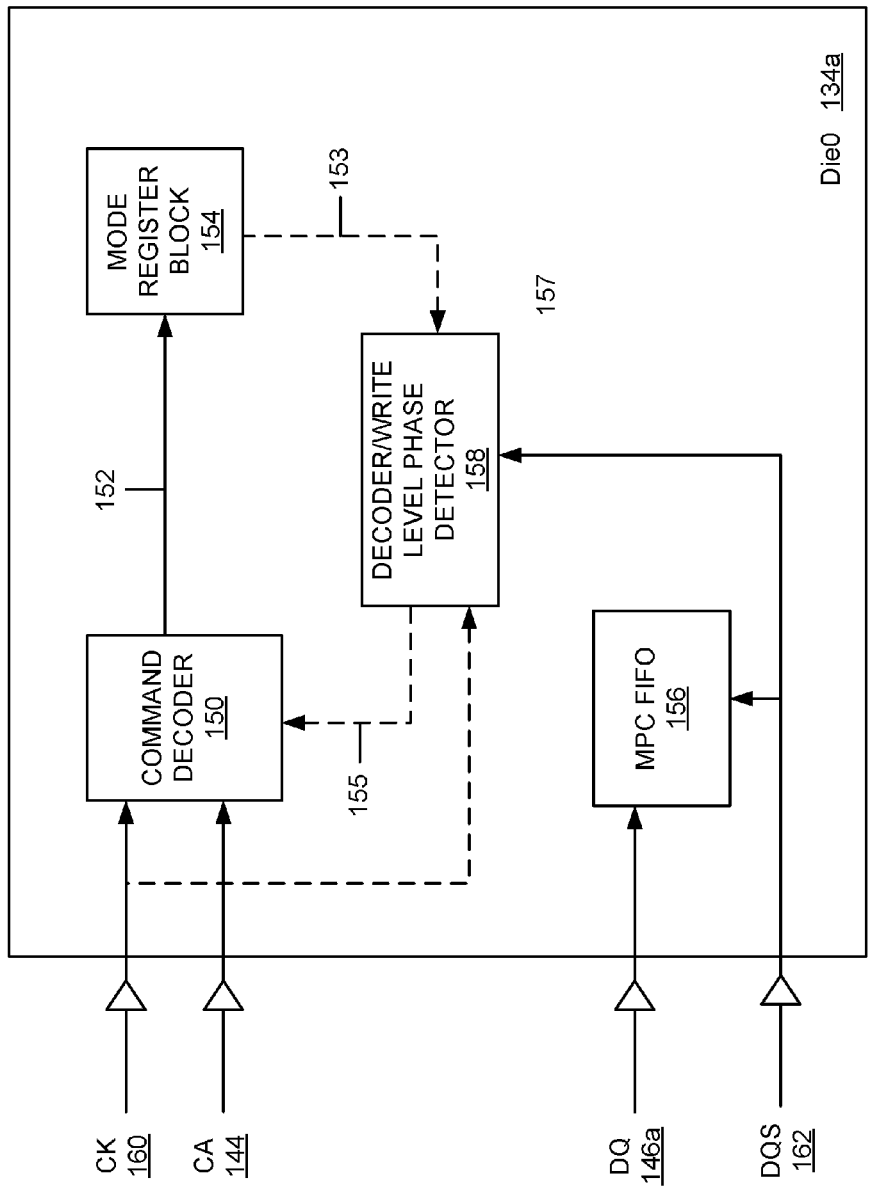

SYSTEMS AND METHODS FOR INDIVIDUALLY CONFIGURING DYNAMIC RANDOM ACCESS MEMORIES SHARING A COMMON COMMAND ACCESS BUS

CROSS-REFERENCE TO RELATED APPLICATION

This application claims the benefit of the priority of U.S. Provisional Patent Application Ser. No. 62/295,236 entitled "Systems and Methods for Individually Configuring Dynamic Random Access Memories Sharing A Common Command Access Bus" and filed on Feb. 15, 2016, which is hereby incorporated by reference in its entirety.

DESCRIPTION OF THE RELATED ART

Computing devices comprising at least one processor coupled to a memory are ubiquitous. Computing devices may include personal computing devices (PCDs) such as desktop computers, laptop computers, portable digital assistants (PDAs), portable game consoles, tablet computers, cellular telephones, smart phones, and wearable computers. One type of memory, dynamic random access memory (DRAM), has become increasing popular in PCDs. DRAM memory devices may be configured and/or operate in accordance with various standards, such as one of the double data rate DDR or Low Power DDR (LPDDR) standards.

DRAM memory devices have an IO (input/output) data bus of a specified width, such as 8 bits (x8), 16 bits (x16), 32 bits (x32), depending on the applicable standard and/or use to which the DRAM will be put. Each DRAM memory device or die typically has its own data (DQ) bus. However, in some configurations or some operational modes, multiple DRAM memories or dies may share a common command address (CA) bus.

For such configurations or operational modes of the DRAM memory or die, the shared or common CA bus prevents individual configuration of the separate DRAM memories or dies using mode register write (MRW) commands during initialization. Instead, all of the DRAM memories or dies are configured the same way due to MRW commands with the configuration information being sent to all of the DRAM memories or dies over the shared or common CA bus. This may result in less than optimal configurations for each of the different DRAM memories or dies.

Accordingly, there is a need for improved systems and methods to implement individual configuration of different DRAM memories or dies that share a common CA bus. In particular there is a need for improved systems and methods for masking MRW commands sent over the CA bus in order to allow individual configuration of each individual DRAM memory or die on the shared CA bus during initialization.

SUMMARY OF THE DISCLOSURE

Systems, methods, and computer programs are disclosed for implementing individual configuration of DRAM memories in communication with a system on chip (SoC), where the DRAM memories share a command address (CA) bus. In one embodiment, the shared command access (CA) bus in communication with a first DRAM device and a second DRAM device is provided. A first command from a system on a chip (SoC) in communication with the first DRAM device and the second DRAM device is received at the first DRAM device. In response to the first command received from the SoC, a decoder of the first DRAM device determines whether to mask a mode register write (MRW) for the first DRAM device.

A second command from the SoC containing configuration information is received at the first DRAM device and the second DRAM device via the shared CA bus. The second command comprises a MRW. If the determination by the decoder was to mask the received MRW, the second command is ignored at the first DRAM device. If the determination by the decoder was to not mask the received MRW, the second command containing the configuration information is executed by the first DRAM device.

Another embodiment is a computer system for a computing device (PCD), the system comprising a system on a chip (SoC). The system also comprising a first DRAM device in communication with the SoC via a first unique data (DQ) bus and over a shared command access (CA) bus, where the first DRAM device includes a first decoder. The system further comprising a second DRAM device in communication with the SoC over a second unique DQ bus and over the shared CA bus.

The first DRAM device is configured to: receive a first command from the SoC; determine with the first decoder whether to mask a mode register write (MRW) for the first DRAM device in response to the first command received from the SoC; receive via the shared. CA bus, a second command from the SoC containing configuration information, wherein the second command comprises a MRW. If the determination by the first decoder was to mask the received MRW, the second command is ignored by the first DRAM device. If the determination by the first decoder was to not mask the MRW, the second command containing configuration information is executed by the first DRAM device.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 3B is a block diagram illustrating aspects of another implementation of a DRAM die that may be used in the system of FIG. 1 and/or the method of FIG. 4A;

DETAILED DESCRIPTION

Figure 1:
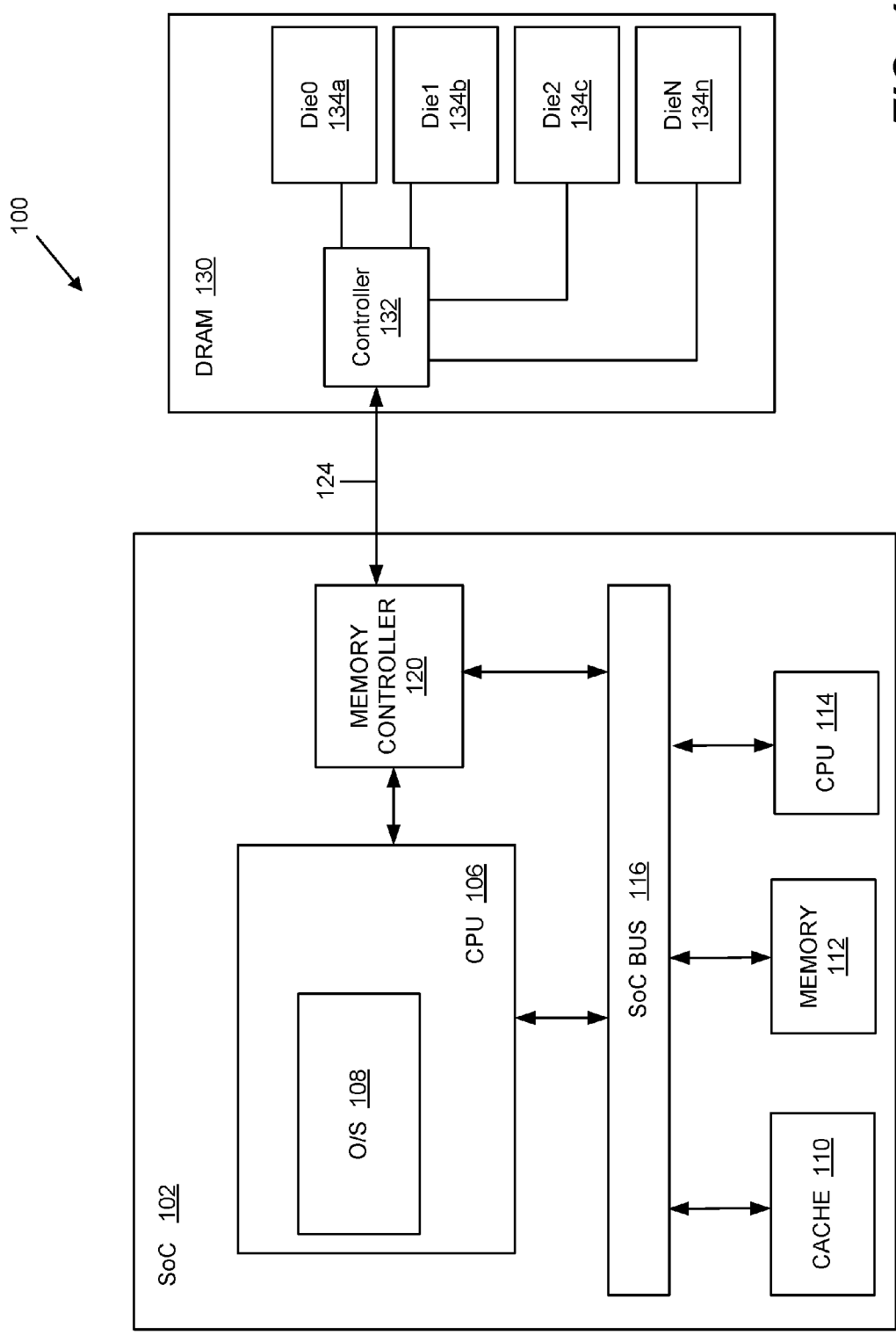
FIG. 1 is a block diagram of an embodiment of a system for implementing individual configuration of DRAM memory devices or dies that share a common CA bus, for a DRAM memory in communication with a system on chip (SoC) of an exemplary computing device.

The word "exemplary" is used herein to mean "serving as an example, instance, or illustration." Any aspect described herein as "exemplary" is not necessarily to be construed as preferred or advantageous over other aspects.

In this description, the term "application" or "image" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the term "computing device" is used to mean any device implementing a processor (whether analog or digital) in communication with a memory, such as a desktop computer, gaming console, or server. A "computing device" may also be a "portable computing device" (PCD), such as a laptop computer, handheld computer, or tablet computer. The terms PCD, "communication device," "wireless device," "wireless telephone", "wireless communication device," and "wireless handset" are used interchangeably herein. With the advent of third generation ("3G") wireless technology, fourth generation ("4G"), Long-Term Evolution (LTE), etc., greater bandwidth availability has enabled more portable computing devices with a greater variety of wireless capabilities. Therefore, a portable computing device may also include a cellular telephone, a pager, a smartphone, a navigation device, a personal digital assistant (PDA), a portable gaming console, a wearable computer, or any portable computing device with a wireless connection or link.

FIG. 1 illustrates an embodiment of a system 100 including a system-on-a-chip (SoC) electrically coupled to a DRAM 130 containing multiple memory devices or dies, such as Die0134*a*, Die1, 134*b*, Die2 134*c*, and DieN 134*n* (collectively referred to as dies 134*a*-134*n*). The system 100 may be used to individually configure the devices or dies 134*a*-134*n* in the DRAM 130, even when the dies 134*a*-134*n* share a common CA bus (see FIG. 2B).

System 100 may be implemented in any computing device, including a POD. As illustrated in the embodiment of FIG. 1, the system 100 comprises the SoC 102 electrically coupled to an external or "off chip" DRAM 130. The SoC 102 comprises various on-chip components, including a central processing unit (CPU) 106, a memory controller 120, a cache 110 memory, and a system memory 112, all interconnected via a SoC bus 116. In some embodiments, such as the one illustrated in FIG. 1, the SoC 102 may also include one or more additional processors like CPU 114 also connected to the SoC bus 116.

The CPU 106 may be controlled by or execute an operating system (OS) 108 that causes the CPU 106 to operate or execute various applications, programs, or code stored in one or more memory of the computing device. In some embodiments the CPU 106 and CPU 114 may be the same type of processor, while in other embodiments the CPU 114 may be a digital signal processor (DSP), a graphics processing unit (GPU), an analog processor, or other type of processor different from CPU 106 executing the OS 108.

The cache 110 memory of FIG. 1 may be an L2, L3, or other desired cache. Additionally the cache 110 may be dedicated to one processor, such as CPU 106, or may be shared among multiple processors in various embodiments, such as the CPU 106 and CPU 114 illustrated in FIG. 1. In an embodiment, the cache 110 may be a last level cache (LLC) or the highest (last) level of cache that the CPU 106 calls before accessing a memory like memory device 130. System memory 112 may be a static random access memory (SRAM), a read only memory (ROM) 112, or any other desired memory type, including a removable memory such as an SD card.

The memory controller 120 of the SoC 102 is electrically connected to the SoC bus 116 and is also connected to the DRAM 130 by a memory access channel 124. The memory access channel 124 may be a serial channel or a parallel channel in various embodiments. Memory controller 120 manages the data read from and/or stored to the various memories accessed by the SoC 102 during operation of the system 100, including DRAM 130. Memory controller 120 may include other portions or components not illustrated FIG. 1, such as a read and/or write buffer, control logic, etc., to allow memory control 120 to control the data transfer over the memory access channel 124. In various implementations, some or all of the components of the memory controller 120 may be implemented in hardware, software, or firmware as desired.

The memory access channel coupling DRAM 130 to the SoC 102 may be any desired width. Data and/or instructions are transferred between CPU 106 (or another component of the SoC 102) and a memory device such as DRAM 130 over the access channel 124. A variety of standards, protocols, or technologies may be used to perform the transfer of the data and instructions, and this disclosure is not limited to any particular data transfer standard.

DRAM 130 may be comprised of any number of devices or dies, such as dies 134a-134n illustrated in FIG. 1. Dies 134a-134n may be of the same or different sizes or capacities. Each DRAM device or die will have an IO (input/output) data bus of a specified width, such as 8 bits (x8), 16 bits (x16), 32 bits (x32), depending on the applicable standard and/or the use for which the DRAM 130 or PCD is intended. Each device or die of the DRAM 130 typically has its own data (DQ) bus to read and write data to the registers of the device/die (see FIGS. 2A-2B).

The DRAM 130 illustrated in FIG. 1 may be a double data rate synchronous dynamic (DDR) RAM according to one of the DDRx or LPDDRx (Low Power DDR) standards. Additionally, DRAM 130 includes a controller 132 coupled to each of the dies 134a-134n to coordinate and control transfer of data and instructions to and from each of die 134a-134n. As will be understood, the DRAM 130 may be a dual in-line memory module (DIMM) comprised one or more memory arrays arranged within the DRAM 130 to store data. These memory arrays may be arranged in ranks in some embodiments as would be understood.

In an embodiment, DRAM 130 may be a LPDDR4 x16 memory with a x16 access channel 124. In such an embodiment, each die 134a-134n of the DRAM 130 will have its own DQ bus and its own CA bus (see FIG. 2A). In another embodiment DRAM 130 may be, or may operate in some operational modes as, a LPDDR4 x8 memory. In such embodiments or operational modes, each die 134a-134n may have its own DQ bus, but the dies 134a-134n may share a common CA bus (see FIG. 2B). Other types and configurations of the DRAM 130 may be implemented in the system 100 in other embodiments.

The elements and arrangement of elements of the system 100, the SoC 102 and/or the DRAM 130 in FIG. 1 are illustrative. In other embodiments, one or more of the system 100, the SoC 102 and/or DRAM 130 may contain more or fewer components than illustrated in FIG. 1. Additionally, in some embodiments, the various components of the system 100, SoC 102 and/or DRAM 130 may be configured differently than illustrated in FIG. 1.

Figure 2A:
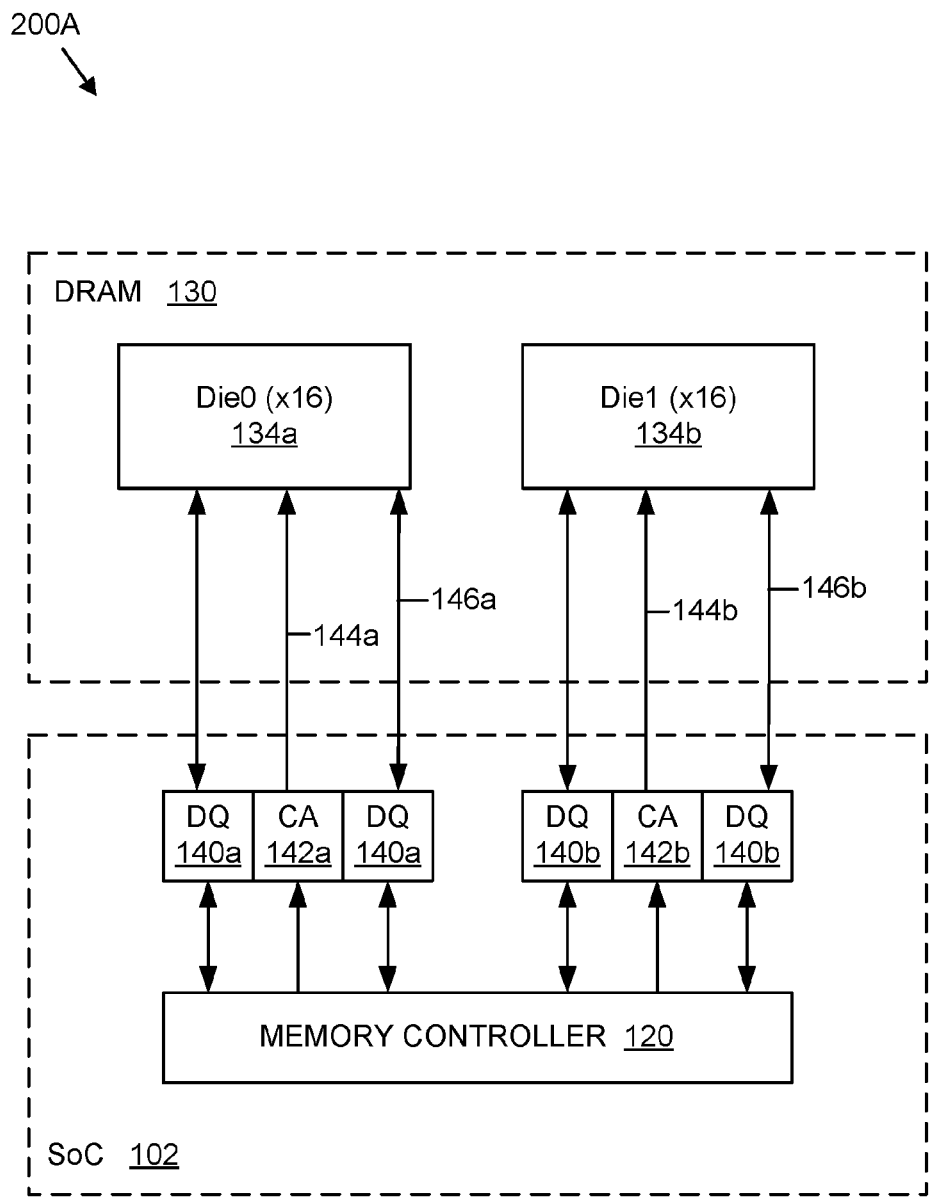
FIG. 2A is a functional diagram showing the interaction of portions of the system of FIG. 1 when the DRAM memory is in a first configuration or mode of operation.
Figure 2B:
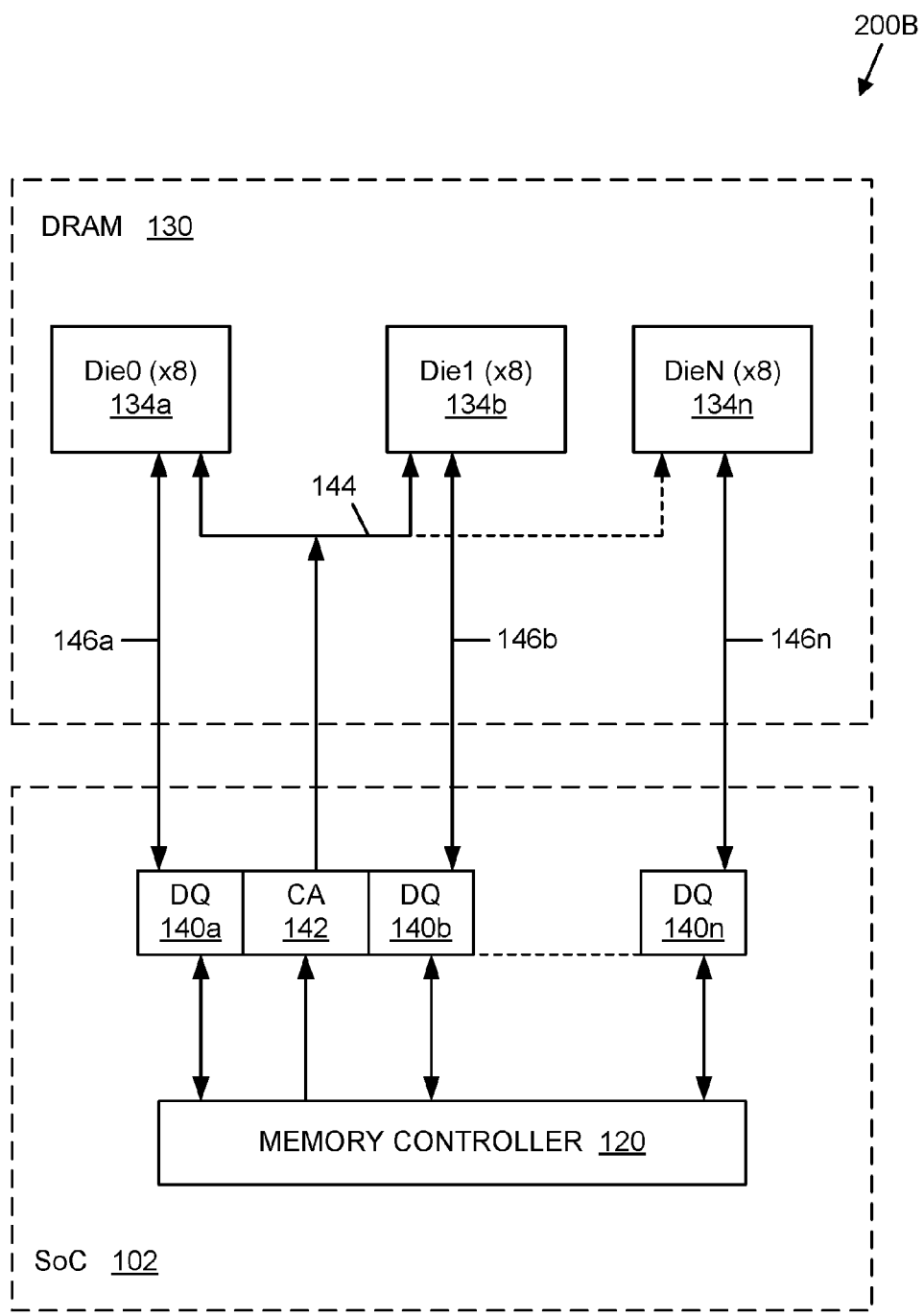
FIG. 2B is a functional diagram showing the interaction of portions of the system of FIG. 1 when the DRAM memory is in a second configuration or mode of operation.

Turning to FIGS. 2A-2B, functional diagrams showing the interaction of portions of the system 100 of FIG. 1 are illustrated. As mentioned, in some configurations of DRAM 130, or modes of operation of DRAM 130, each device or die (illustrated as Die0 134a and Die1 134b) of the DRAM 130 may have its own CA bus, 144a and 144b respectively. A functional diagram 200A of portions of the system 100 for such a configuration/mode of operation of DRAM 130 is illustrated in FIG. 2A. In such a configuration Die0 134a will receive control commands, such as mode register write (MRW) commands, over a CA bus 144a dedicated to Die0 134a. Similarly, Die1 134b can receive separate or different control commands over its own dedicated CA bus 144b.

These separate or different control commands may be sent from outside the DRAM 130, such as from memory controller 120 of SoC 102 for instance. Each separate command will only be received by the intended die 134a or 134b. Thus, the separate CA buses 142a and 142b allow each of Die0 134a and Die1 134b to be separately controlled and configured. For instance, at initialization of a PCD it is beneficial to configure various programmable settings in a DRAM 130 using MRW commands to ensure optimal performance of the DRAM 130. As will be understood, these programmable settings may include a voltage reference value (Vref) or any other desired setting for the Die0 134a. As will also understood, the appropriate values for such programmable settings can vary from Die0 134a to Die1 134b, and the appropriate may depend on a variety of factors unique to each die 134a-134b. Thus, it is desirable to be able to individually program or configure Die0 134a and Die1 134b to ensure optimal performance, such as to reduce error rates for example. Such individual configuration of Die0 134a and Die1134b is available when each die 134a and 134b has its own dedicated CA bus 144a and 144b, respectively, as illustrated in FIG. 2A.

However, as illustrated in FIG. 2B, in some configurations of DRAM 130, or for some operational modes of DRAM 130 according various standards, multiple devices or dies of a DRAM 130 may share a common CA bus. An example of such configuration/mode of operation is illustrated in FIG. 2B, where Die0 134a, Die1 134b, and DieN 134n (collectively referred to as dies 134a-134n) share a common CA bus 144. Note that although illustrated with three dies 134a-134n, more or fewer dies may be coupled to the common or shared CA bus 144 as desired, subject to architectural limitations and the electrical capabilities of DRAM 130. Additionally, although Die0 134a and Die1 134b are illustrated in FIG. 2B as x8 dies, one or more of Die 0 134, Die1 134b and/or DieN 134n may have a different IO width, such as x32, etc.

Because dies 134a-134n share a common CA bus 144, dies 134a-134n are not individually controllable or configurable using typical commands over the shared CA bus 144. Any control command, such as an MRW command sent over the shared CA bus 144, is received and implemented by all of the dies 134a-134n. The system and methods of the present disclosure allow for the dies 134a-134n to be separately and/or individually configured, even though dies 134a-134n share a common CA bus 144. In this manner, each die 134a-134n may be individually configured without the need for separate CA buses as illustrated in FIG. 2A. Thus, if a DRAM 130 is required to use a shared CA bus 144 to support an operational mode (such as the "byte mode" of operation in the LPR4 standard), or if it is desired to avoid the footprint, overhead, etc. of a separate CA bus 144 on each die 134a, 134b, 134n, the present disclosure still allows for individual configuration of dies 134a-134n.

Figure 3A:
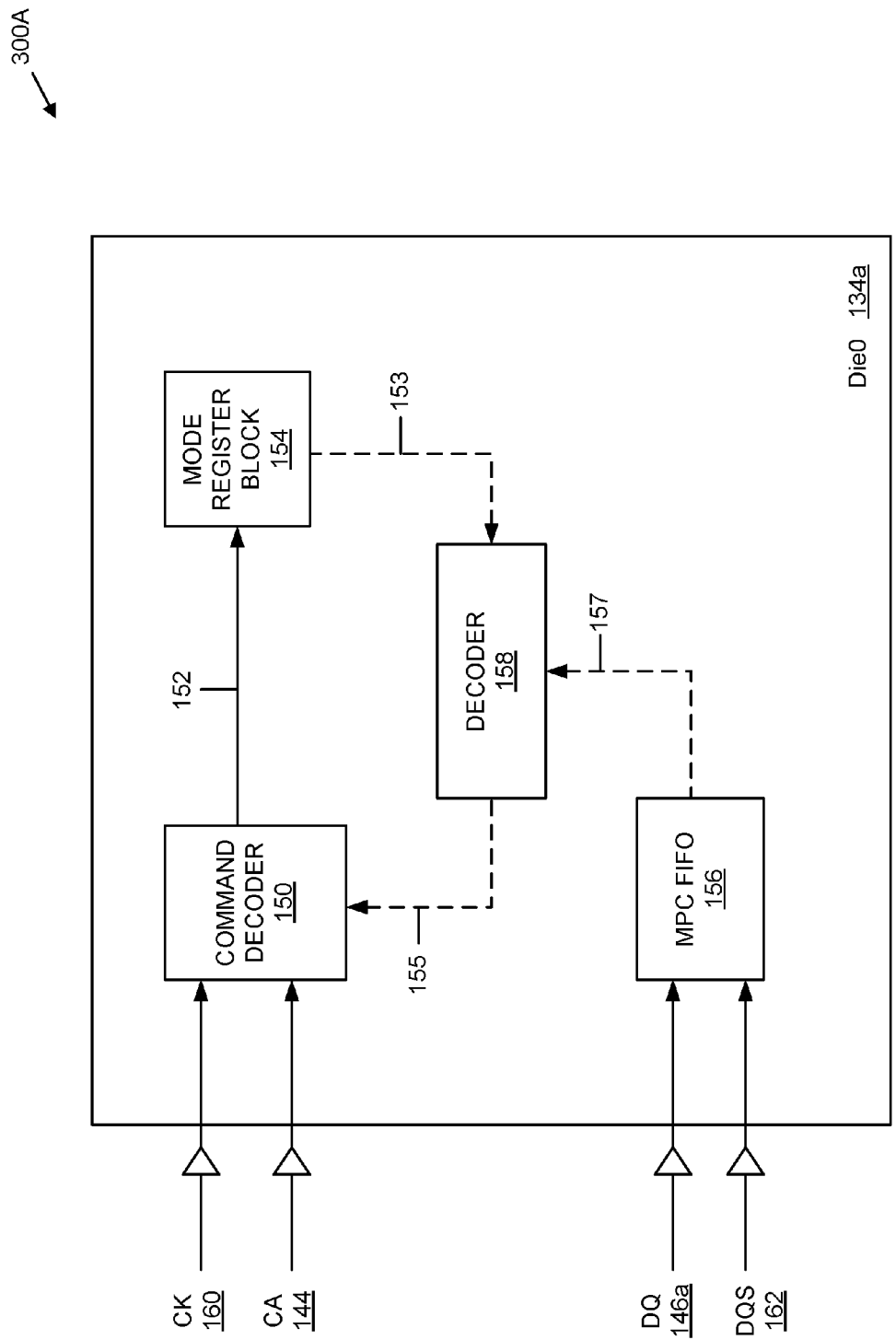
FIG. 3A is a block diagram illustrating aspects of an embodiment of a DRAM die that may be used in the system of FIG. 1 and/or the method of FIG. 4A.

FIGS. 3A-3B are block diagrams illustrating embodiments of a DRAM die, Die0 134a that may be used in the system of FIG. 1. Although not illustrated, Die0 134a shares a common CA bus 144 with other dies, such as Die1 134b and DieN 134n as illustrated in FIG. 2B. Additionally, although discussed in terms of Die0 134a, the following discussion of the various embodiments and implementations is equally applicable to any die that shares the common CA bus 144 with Die0 134a, such as Die1 134b and DieN 134n illustrated in FIG. 2B.

Die0 134a includes a decoder 158 that allows individual programming, configuration, or control of Die0 134a using information received over the DQ bus 146a unique to Die0 134a. In some embodiments such programming, configuration, or control of Die0 134a using the decoder 158 may be accomplished with just information received over the DQ bus 146a. In other embodiments, such programming, configuration, or control of Die0 134a using the decoder 158 may be accomplished with information received over the DQ bus 146a in combination with information received over the shared CA bus 144.

Turning to FIG. 3A, Die0 134a includes a command decoder 150 that receives typical command signals and a clock signal CK 160 over the shared CA bus 144. Command decoder 150 may be implemented in hardware, software, or a combination of hardware and software as desired. Die0 134a also includes a mode register block 154 in communication with the command decoder 150. When the command decoder 150 receives a MRW command over the shared CA bus 144, the command decoder 150 either forwards the MRW command to the mode register block 154, or sends a signal 152 to the mode register block 154 indicating that the MRW command has been received. The command decoder 150 also sends data associated with that MRW command, such as information identifying a setting of Die0 134a to be configured and the value for the setting.

Die0 134a also includes a buffer, such as MPC FIFO 156 that receives information and a pulse signal (DQS 162) over the unique DQ bus 146a for Die0 134a. Among the information received by the MPC FIFO 156 over the DQ bus 146a may be a multipurpose command (MPC). MPC FIFO 156 may be implemented in hardware, and may include or may be associated with logic to control the operation of MPC FIFO 156. As indicated by its name, MPC FIFO 156 in the embodiment of FIG. 3A is a first-in-first-out (fifo) buffer, however other buffers may be used as desired.

In some embodiments, such as the embodiment of FIG. 3A, command decoder 150, mode register block 154, and MPC FIFO 156 may all be coupled to decoder 158. In this embodiment, decoder 158 determines whether to mask MIRW commands received Die0 134a. If decoder 158 determines to mask MRW commands received by Die0 134a, decoder 158 may send a mask signal 155 to command decoder 150. The mask signal 155 instructs command decoder 150 to disregard the next MRW command received, or to disregard all subsequent MRW commands until another signal is sent from the decoder 158. These subsequent MRW command(s) received over the shared CA bus 144 will not be implemented by Die0 134a. As a result, any configuration information in the subsequent MIRW commands will be ignored by Die0 134a. Instead, the subsequent MIRW command(s) may be implemented by one or more other dies Die1 134b, DieN 134n, etc. (see FIG. 2B) using the shared CA bus 144 if one or more of those other dies 134b-134n are not masked.

If, on the other hand, decoder 158 determines not to mask MIRW commands received by Die0 134a, no mask signal 155 is sent from the decoder 158. Subsequent MRW command(s) received over the shared CA bus 144 will be implemented by Die0 134a. As a result, any configuration information in these subsequent MIRW commands will be set at Die0 134a. At the same time, the subsequent MRW commands may instead be ignored by the other dies 134b-134n (see FIG. 2B) that are using the shared CA bus 144. By configuring each of dies 134a-134n with a decoder 158 as described above, each die 134a-134n may selectively mask MRW commands, allowing each of die 134a-134n to be individually configured despite dies 134a-134n all sharing a common CA bus 144.

Decoder 158 of Die0 134 of this embodiment may be implemented and/or operated in a variety of ways as desired. For example, in the embodiment of FIG. 3A, a command may be received at the command decoder 150 of Die0 134a via the shared or common CA bus 144. The command may be a MRW command or another command that causes command decoder 150 to send a signal 152 to the mode register block 154. The command received at the command decoder 150 may include a bit or other information that causes the command decoder 150 to send the signal 152 to the mode register block 154. The command decoder 150 may include logic to recognize the received command and cause the signal 152 to be generated and sent to the mode register block 154.

Upon receiving the signal 152, the mode register block 154 causes a wake-up/enable signal 153 to be sent to the decoder 158. The mode register block 154 may include logic to recognize the received signal 152 from the command decoder 150 and to generate and send the wake-up/enable signal 153 to the decoder 158. The wake-up/enable signal 153 is configured to awaken, enable, and/or cause the decoder 158 to become active. In an implementation, awakening the decoder 158 may comprise causing the decoder 158 to poll the MPC FIFO 156 or otherwise look for information from the MPC FIFO 156. As illustrated in FIG. 3A, the decoder 158 may be coupled to an output of the MPC FIFO 156.

Separately in this implementation, information is sent to Die0 134a over the DQ bus 146a to MPC FIFO 156. As discussed, the DQ bus 146a is unique to Die0. The received information is provided from MPC FIFO 156 to decoder 158, such as by signal 157. Decoder 158 is configured to recognize or determined from the received signal 157 whether to mask MRW commands for Die0 134a. For example, in an implementation, the information received over the DQ bus 146a may include a masking bit, and decoder 158 may include logic to recognize whether the received masking bit is "on" or "off" and accordingly determine whether to mask MRW commands for Die0 134a. In other implementations, the information received over the DQ bus 146a may include a different instruction or information that is recognized by decoder 158 and from which decoder 158 can determine whether to mask MRW commands for Die0 134a.

If decoder 158 determines to mask MRW commands received by Die0 134a, decoder 158 send a mask signal 155 to the command decoder 150 in the implementation of FIG. 3A. The mask signal 155 may instruct command decoder 150 to disregard the next MRW command received. In another implementation, the mask signal 155 may cause command decoder 150 to disregard all subsequent MRW commands until a second mask signal 155 is sent from the decoder 158. The second mask signal 155 may be generated by the decoder 158 in response to a second instruction or command received by the MPC FIFO 156 over the DQ 146a bus. This second instruction may be provided from the MPC FIFO 156 to the decoder 158 and understood by the decoder 158 to be an instruction to stop masking MRW commands, causing the decoder to generate second mask signal 155.

Regardless of how the mask signal 155 is implemented, once the command decoder 150 receives the initial mask signal 155 indicating that MRW commands should be masked, subsequent MRW command(s) received over the shared CA bus 144 will not be implemented by Die0 134a. As a result, any configuration information in the subsequent MRW command(s) will be ignored by Die0 134a. Instead, the subsequent MRW commands may be implemented by one or more other dies 134b-134n (see FIG. 2B) using the shared CA bus 144, if one or more of those other dies 134b-134n are not masked. As will be understood, implementing a decoder 158 in each of dies 134a-134n allows each of dies 134a-134n to have MRW commands unmasked in turn, such that each of dies 134a-134n may be individually configured by MRW commands over the shared or common CA bus 144.

A second implementation of Die0 134a is illustrated in FIG. 3B. In this second implementation, the decoder 158 may be implemented as a write level phase detector. As with the discussion above for FIG. 3A, in the implementation of FIG. 3B a command may be received at the command decoder 150 of Die0 134a via the shared or common CA bus 144. The command may be a MRW command or another command that causes command decoder 150 to send a signal 152 to the mode register block 154. The command received at the command decoder 150 may include a bit or other information that causes the command decoder 150 to send the signal 152 to the mode register block 154. The command decoder 150 may include logic to recognize the received command and cause the signal 152 to be generated and sent to the mode register block 154. Upon receiving the signal 152, the mode register block 154 causes a wake-up/enable signal 153 to be sent to the decoder/phase detector 158.

Once the decoder/phase detector 158 of FIG. 3B is awakened/enabled, a DQS pulse 162 received by Die0 134a via the DQ bus 146a is received by the decoder/phase detector 158. From the DQS pulse 162 and/or the information about the phase of the DQS pulse 162, decoder/phase detector 158 is configured to recognize or determine whether to mask MRW commands. Once the decoder/phase detector 158 makes this determination it sends the mask signal 155 to the command decoder 150 if the determination is to mask MRW commands, as discussed above for FIG. 3A.

Figure 3C:
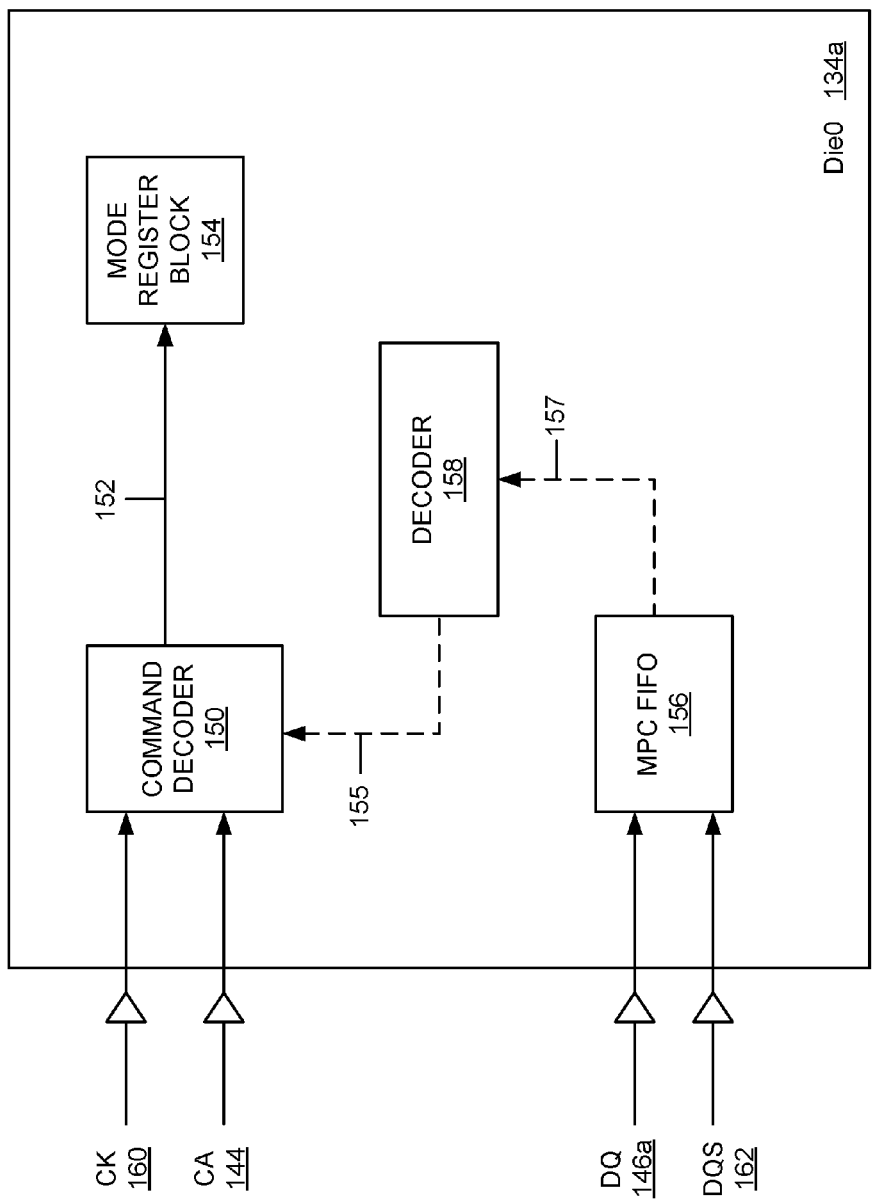
FIG. 3C is a block diagram illustrating aspects of an alternative embodiment to FIGS. 3A-3B for a DRAM die that may be used in the system of FIG. 1 and/or the methods of FIG. 4B or 4C.

An alternative embodiment to FIGS. 3A-3B is illustrated in FIG. 3C. In the embodiment of FIG. 3C, decoder 158 contains or implements logic to enable Die0 134a to set various configurations from information initially received over the DQ bus 146a unique to Die0134a. In this embodiment, an instruction received at the MPC FIFO 156 over the DQ bus 146a causes the decoder 158 to act, without the need for a previous wake up/enable/alert signal to the decoder 158 (see FIGS. 3A-3B). Information received at the MPC FIFO 156 over the DQ bus 146a, such as an MPC command may be recognized by the decoder 158 as an instruction. For example, under the MPC standard, various bits are "reserved" and one or more of such reserved bits may be defined as an instruction recognized by the decoder 158 in this embodiment. As would be understood, instructions or information received over the DQ bus 146a other than the MPC command could also be used.

For example, in an implementation, a reserve bit in the MPC command (or other instruction) may be received over the DQ bus 146a and provided to decoder 158. From the received instruction and/or other information, decoder 158 is configured to recognize or determine whether to mask MRW commands received over the shared CA bus 144. In this implementation, once the decoder 158 makes the determination it sends the mask signal 155 to the command decoder 150 if the determination is to mask MRW commands as discussed above for FIGS. 3A-3B.

In another implementation, a reserve bit in the MPC command (or other instruction) may be received over the DQ bus 146a and provided to decoder 158. Additionally, information or data about the desired configurations for Die0 134a may also be provided over the DQ bus 146a. From the received instruction, decoder 158 is configured to recognize or determine that configuration instructions and/or information have been received over the DQ bus 146a. In this implementation, the decoder 158 is further configured to send an instruction and/or the configuration information via signal 155 to the command decoder 150. The command decoder 150 is configured to send the appropriate command, such as a MRW command to mode register block 154 to set the desired configurations for Die0 134a. Thus, in this implementation, information received at the decoder 158 from the DQ bus 146a causes the configurations for Die0 134a to be set, without the need to mask any MRW commands received over the CA bus 144.

Figure 4A:
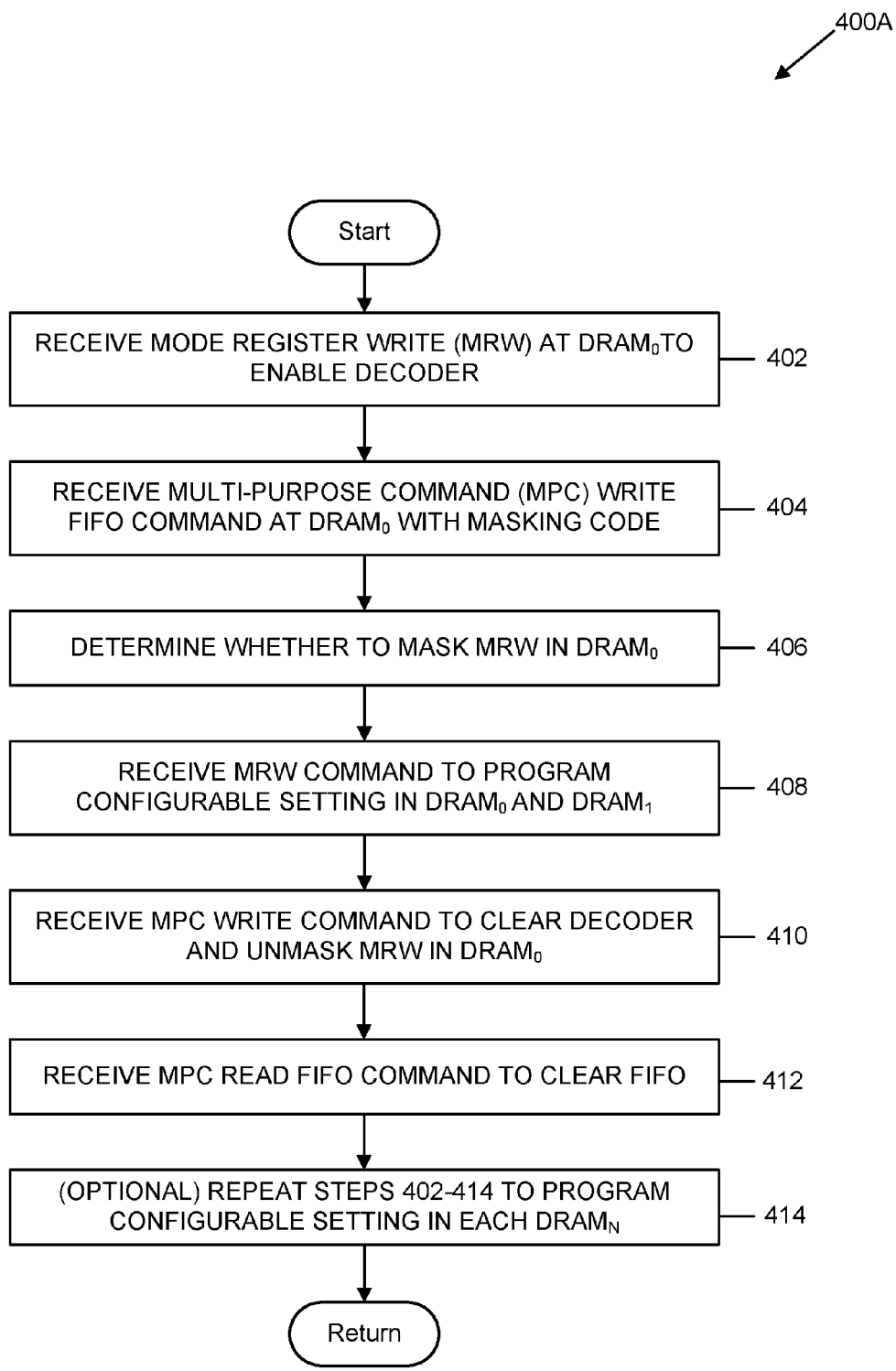
FIG. 4A is a flowchart illustrating an embodiment of a method for providing individual configuration of DRAM memories or dies that share a common CA bus that may be implemented in a system such as that shown in FIG. 1.

Turning to FIG. 4A an embodiment of a method 400A for providing individual configuration of DRAM memories or dies that share a common CA bus is illustrated. Method 400A begins in block 402 where a command, such as a mode register write (MRW) command is sent to a DRAM device or die to enable a decoder located on the DRAM device. The DRAM device may be Die0 134a illustrated in FIGS. 1, 2B, and/or 3A. DRAM device/Die0 134a shares a common CA bus 144 with other dies such as dies 134b-134n (see FIG. 2B). The command in block 402 may be sent from outside the DRAM device/Die0 134a, such as from a memory controller 120 of SoC 102 in communication with the DRAM device/Die0 134a (see FIGS. 1 and 2B). The command of block 402 is received by the DRAM device/Die0 134a over the shared or common CA bus 144, such as at a command decoder 150 (see FIG. 3A-3B). The command decoder 402 may then cause a mode register block to send a wake-up/enable signal 153 to the decoder 158.

In block 404 an instruction, such as a multi-purpose command (MPC) write fifo command is sent to the DRAM device/Die0 134a. This instruction may also be sent from outside the DRAM device/Die0 134a, such as from memory controller 120 of SoC 102. This instruction is received over the unique DQ bus 146a of the DRAM device/Die0 134a. The instruction may contain information used to determine whether to mask subsequent MRW commands. In an implementation, the instruction may comprise data or information from which a decoder 158 may recognize or determine whether to mask MRW commands for DRAM device/Die0 134a (see FIG. 3A). In another implementation, the instruction may comprise a DQS pulse 162 from which decoder 158 may recognize or determine whether to mask MRW commands for DRAM device/Die0 134a (see FIG. 3B).

Continuing to block 406, MRW commands are masked at DRAM device/Die0 134a. Masking the MRW commands may be implemented by decoder 158 of DRAM device/Die0 134a determining from the instruction received over the DQ bus 146a whether to mask MRW commands. If the decoder 158 determines to mask MRW commands, the decoder may send a mask signal 155 to the command decoder 150.

In block 408 an MRW command to program configurable settings in a second DRAM, such as DRAM device/Die1 134b (see FIG. 2B) is sent over the common or shared CA bus 144. In an embodiment the configurable settings may be a Vref setting or any other configurable setting that optimizes performance of the individual DRAM device/Die1 134b, such as by minimizing error rates.

DRAM device/Die1 134b receives the MRW command over the shared/common CA bus 144. However, DRAM device/Die1 134b has not been masked, so the settings for DRAM device/Die1 134b are programmed in accordance with the MRW command. For example, command decoder 150 may send a signal 152 to mode register block 154 to implement the configurations/settings. As will be understood, DRAM device/Die0 134a also receives the MRW command over the shared/common CA bus 144. However, MRW commands have been masked for DRAM device/Die0 134a, so the MRW command is ignored by this DRAM device. As a result, the settings/configurations—intended for separate DRAM device/Die1 134b—are not implemented by DRAM device/Die0 134a.

In block 410 the decoder 158 of DRAM device/Die0 134a is cleared and/or the MIRW commands unmasked in DRAM device/Die0 134a. This may comprise a second instruction sent from outside the DRAM device, such as from memory controller 120 of SoC 102. This second instruction is received over the DQ bus 162*a* of DRAM device/Die0 134*a* and may comprise a second MPC write command that is received at the MPC FIFO 156 and/or decoder 158. This second instruction may in an embodiment cause decoder 158 to send another mask signal 155 to the command decoder 150 to unmask future MIRW commands. Additionally, block 410 may comprise the command decoder 150 sending a signal to mode register block 154, which in turn sends a signal 153 to clear the decoder 158 and/or cause the decoder 158 to cease looking for instructions from the DQ bus 146*a*.

In block 412 an MPC read fifo command is sent to DRAM device/Die0 134*a* to clear the MPC FIFO 156. This command in block 412 may be sent from outside the DRAM device/Die0 134*a*, such as by memory controller 120 of the SoC 102. This command may be received at DRAM device/Die0 134*a* via DQ bus 146*a*. In optional block 414, the steps of blocks 402-412 may be repeated for each DRAM device such as dies 134*a*-134*n* (FIG. 2B). In this manner each of dies 134*a*-134*n* may have their configurations/settings programmed individually, despite dies 134*a*-134*n* sharing a common CA bus 144.

Figure 4B:
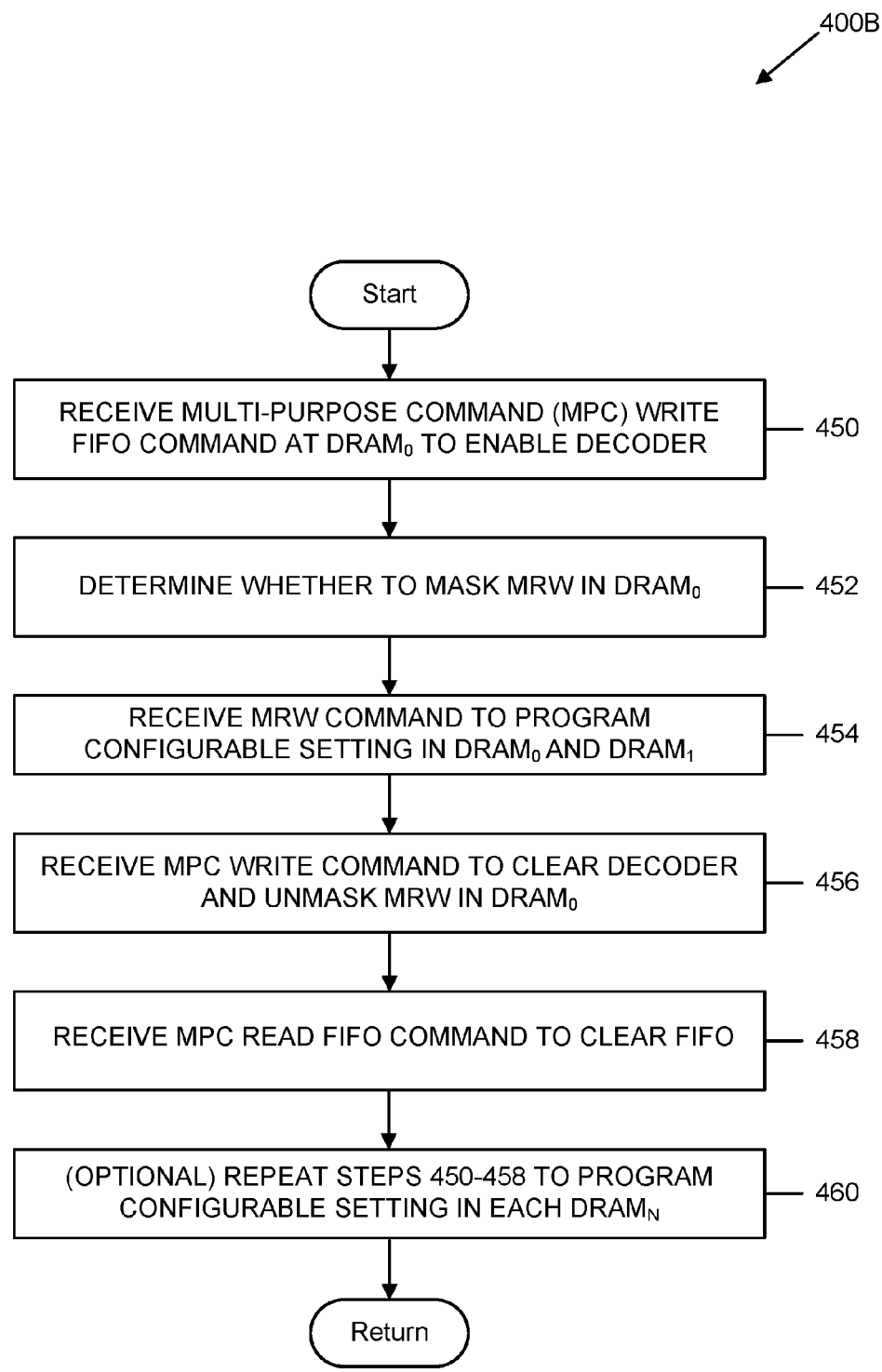
FIG. 4B is a flowchart illustrating an alternative embodiment of a method for providing individual configuration of DRAM memories or dies that share a common CA bus that may be implemented in a system such as that shown in FIG. 1.

FIG. 4B is a flowchart illustrating an alternative method 400B for providing individual configuration of DRAM memories or dies that share a common CA bus. In block 450 an instruction, such as a multi-purpose command (MPC) write fifo command is sent to the DRAM device, such as Die0 134*a* (see FIGS. 1, 2B, and 3C). This instruction may be sent from outside the DRAM device/Die0 134*a*, such as from memory controller 120 of SoC 102 (FIGS. 1 and 2B). This instruction may be received over the unique DQ bus 146*a* of the DRAM device/Die0 134*a*. The instruction may contain information used determine whether to mask subsequent MRW commands. In an implementation, the instruction may comprise data or information from which the determination whether to mask subsequent MRW commands may be made. In another implementation, the instruction may comprise a DQS pulse 162 from which the determination whether to mask subsequent MRW commands may be made.

In block 452, MRW commands are masked the DRAM device/Die0 134*a* similar to block 406 discussed above for FIG. 4A. Masking the MRW commands may be implemented by the decoder 158 of DRAM device/Die0 134*a* determining from the instruction received over the DQ bus 146*a* whether to mask MRW commands. If the decoder 158 determines to mask MRW commands, the decoder may send a mask signal 155 to the command decoder 150 as discussed above.

In block 454 similar to block 408 discussed above for FIG. 4A—a MRW command to program configurable settings in a second DRAM, such as DRAM device/Die1 134*b* (see FIG. 2B) is sent over the common or shared CA bus 144. In an embodiment the configurable settings may be a Vref setting or any other configurable setting that optimizes performance of the individual DRAM device/Die1 134*b*, such as by minimizing error rates.

DRAM device/Die1 134*b* receives the MRW command over the shared/common CA bus 144. However, DRAM device/Die1 134*b* has not been masked, so the settings for DRAM device/Die1 134*b* are programmed in accordance with the MRW command. For example, command decoder 150 of DRAM device/Die1 134*b* may send a signal 152 to mode register block 154 to implement the configurations/settings for DRAM device/Die1 134*b*. As will be understood, DRAM device/Die0 134*a* also receives the MRW command over the shared/common CA bus 144. However, DRAM device/Die0 134*a* has been masked, so the MRW command is ignored by this DRAM device. As a result, the settings/configurations—intended for separate DRAM device/Die1 134*b*—are not implemented by DRAM device/Die0 134*a*.

In block 456 the decoder 158 of DRAM device/Die0 134*a* is cleared and/or the MRW commands unmasked in DRAM device/Die0 134*a*, similar to block 410 discussed above for FIG. 4A. This may comprise a second instruction sent from outside the DRAM device, such as from memory controller 120 of SoC 102. This second instruction is received over the DQ bus 162*a* of DRAM device/Die0 134*a* and may comprise a second MPC write command that is received at the MPC FIFO 156 and/or decoder 158. This second instruction may in an embodiment case the decoder 158 to send another mask signal 155 to the command decoder 150 to unmask future MRW commands. Additionally, block 456 may comprise the command decoder 150 sending a signal to mode register block 154, which in turn sends a signal 153 to clear the decoder 158 and/or cause the decoder 58 to cease looking for instructions from the DQ bus 146*a*.

In block 458 an MPC read fifo command is sent to DRAM device/Die0 134*a* to clear the MPC FIFO 156. This command in block 458 may be sent from outside the DRAM device/Die0 134*a*, such as by memory controller 120 of the SoC 102. This command may be received at DRAM device/Die0 134*a* via DQ bus 146*a*. In optional block 460, the steps of blocks 450-458 may be repeated for each DRAM device such as dies 134*a*-134*n* (FIG. 2B). In this manner each of dies 134*a*-134*n* may have their configurations/settings programmed individually, despite dies 134*a*-134*n* sharing a common CA bus 144.

Figure 4C:
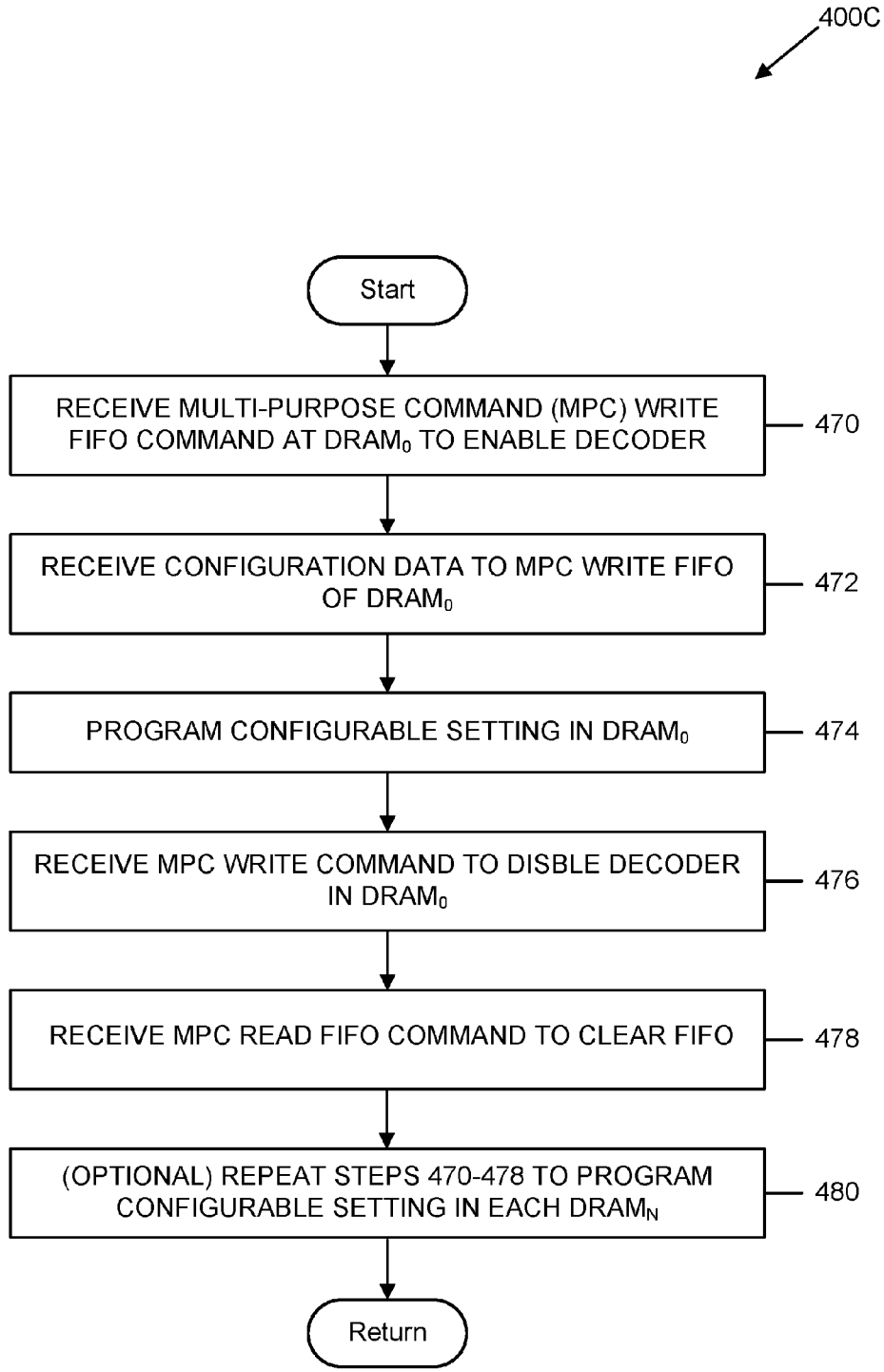
FIG. 4C is a flowchart illustrating another implementation of the alternative embodiment of the method of FIG. 4B.

FIG. 4C is a flowchart illustrating another implementation of the alternative embodiment of the method 400B of FIG. 4B. As illustrated in FIG. 4C, method 400C begins with block 470 where an instruction, such as a multi-purpose command (MPC) write fifo command is sent to the DRAM device/Die0 134*a*. This instruction is sent from outside the DRAM device, such as by memory controller 120 of SoC 102. This instruction may be received over the unique DQ bus 146*a* of the DRAM device/Die0 134*a*. The instruction may contain information to enable the decoder 158 to operate, without need for additional instructions or commands over the shared or common CA bus 144, and without the need for any previous wake up/enable/alert signal to the decoder 158 (see FIGS. 3A-3B). Information received over the DQ bus 146*a*, such as an MPC command may be recognized by the decoder 158 as an instruction. For example, under the MPC standard various bits are "reserved" and such reserved bits may be defined as an instruction recognized by the decoder 158 in this embodiment.

In block 472 information or data about the desired configurations for DRAM device/Die0 134*a* is also provided over the DQ bus 146*a*. Note that in some implementations, blocks 470 and 472 may not be separate steps, but instead may comprise one sending of instructions and information to the DRAM device/Die0 134*a* over the DQ bus 146*a*

In block 474 the desired configurations/settings of the DRAM device/Die0 134*a* are programmed. As discussed above, the decoder 158 of DRAM device/Die0 134*a* is able to recognize that configuration instructions and/or information of blocks 470/472 have been received over the DQ bus 146*a*. Programming the configurations in block 474 may comprise the decoder 158 recognizing the received instructions, and sending an instruction and/or the configuration information via signal 155 to the command decoder 150.

The command decoder 150 may send the appropriate command, such as a MRW command to mode register block 154, to set the desired configurations for DRAM device/Die0 134a.

In block 476 the decoder 158 of DRAM device/Die0 134a is cleared. This may comprise a second instruction sent from outside the DRAM device, such as from memory controller 120 of SoC 102. This second instruction is received over the DQ bus 162a of DRAM device/Die0 134a and may comprise a second MPC write command that is received at the MPC FIFO 156 and/or decoder 158. The decoder 158 may recognize this second instruction as an instruction to disable and/or cease looking for instructions from the DQ bus 146a.

In another implementation, this second instruction may cause the decoder 158 to send a signal 155 to the command decoder 150. The command decoder 150 may then send a signal to mode register block 154, which in turn may send a signal 153 to decoder 158 to clear the decoder 158 and/or cause the decoder 158 to cease looking for instructions from the DQ bus 146a.

In block 478 an MPC read fifo command is sent to DRAM device/Die0 134a to clear the MPC FIFO 156. This command in block 478 may be sent from outside the DRAM device/Die0 134a, such as by memory controller 120 of the SoC 102. This command may be received at DRAM device/Die0 134a via DQ bus 146a. In optional block 480, the steps of blocks 470-478 may be repeated for each DRAM device such as dies 134a-134n (FIG. 2B). In this manner each of dies 134a-134n may have their configurations/settings programmed individually, despite dies 134a-134n sharing a common CA bus 144.

Figure 5:
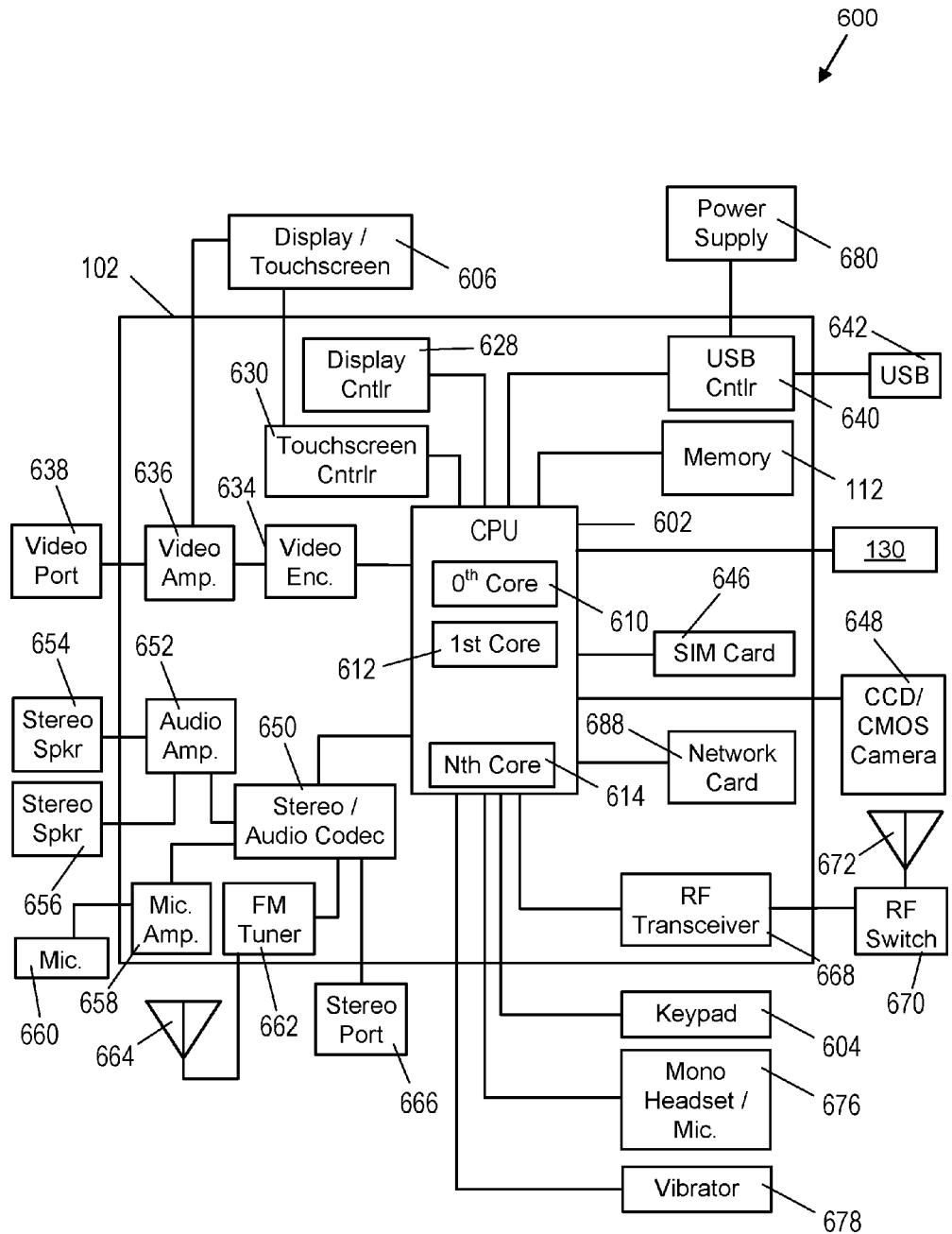
FIG. 5 is a block diagram of an exemplary computing device in which the system of FIG. 1 or method of FIG. 4 may be implemented.

System 100 (FIG. 1), as well as methods 400A-400C (FIGS. 4A-4C) may be incorporated into or performed by any desired computing system, including a PCD. FIG. 5 illustrates the system 100 incorporated in an exemplary PCD 600. In this embodiment, the SoC 102 may include a multicore CPU 602. The multicore CPU 602 may include a zeroth core 610, a first core 612, and an Nth core 614. One of the cores may comprise, for example, a graphics processing unit (GPU) with one or more of the others comprising the CPU.

A display controller 628 and a touch screen controller 630 may be coupled to the CPU 602. In turn, the touch screen display 606 external to the on-chip system 102 may be coupled to the display controller 628 and the touch screen controller 630. FIG. 5 further shows that a video encoder 634, e.g., a phase alternating line (PAL) encoder, a sequential color a memoire (SECAM) encoder, or a national television system(s) committee (NTSC) encoder, is coupled to the multicore CPU 602. Further, a video amplifier 636 is coupled to the video encoder 634 and the touch screen display 606.

Also, a video port 638 is coupled to the video amplifier 636. As shown in FIG. 5, a universal serial bus (USB) controller 640 is coupled to the multicore CPU 602. Also, a USB port 642 is coupled to the USB controller 640. Memory 112 and a subscriber identity module (SIM) card 646 may also be coupled to the multicore CPU 602.

Further, as shown in FIG. 5, a digital camera 648 may be coupled to the multicore CPU 602. In an exemplary aspect, the digital camera 648 is a charge-coupled device (CCD) camera or a complementary metal-oxide semiconductor (CMOS) camera.

As further illustrated in FIG. 5, a stereo audio coder-decoder (CODEC) 650 may be coupled to the multi core CPU 602. Moreover, an audio amplifier 652 may be coupled to the stereo audio CODEC 650. In an exemplary aspect, a first stereo speaker 654 and a second stereo speaker 656 are coupled to the audio amplifier 652. FIG. 5 shows that a microphone amplifier 658 may be also coupled to the stereo audio CODEC 650. Additionally, a microphone 660 may be coupled to the microphone amplifier 658. In a particular aspect, a frequency modulation (FM) radio tuner 662 may be coupled to the stereo audio CODEC 650. Also, an FM antenna 664 is coupled to the FM radio tuner 662. Further, stereo headphones 666 may be coupled to the stereo audio CODEC 650.

FIG. 5 further illustrates that a radio frequency (RF) transceiver 668 may be coupled to the multicore CPU 602. An RF switch 670 may be coupled to the RF transceiver 668 and an RF antenna 672. A keypad 604 may be coupled to the multicore CPU 602. Also, a mono headset with a microphone 676 may be coupled to the multicore CPU 602. Further, a vibrator device 678 may be coupled to the multicore CPU 602.

FIG. 5 also shows that a power supply 680 may be coupled to the on-chip system 102. In a particular aspect, the power supply 680 is a direct current (DC) power supply that provides power to the various components of the PCD 600 that require power. Further, in a particular aspect, the power supply is a rechargeable DC battery or a DC power supply that is derived from an alternating current (AC) to DC transformer that is connected to an AC power source.

FIG. 5 further indicates that the PCD 600 may also include a network card 688 that may be used to access a data network, e.g., a local area network, a personal area network, or any other network. The network card 688 may be a Bluetooth network card, a WiFi network card, a personal area network (PAN) card, a personal area network ultra-low-power technology (PeANUT) network card, a television/cable/satellite tuner, or any other network card well known in the art. Further, the network card 688 may be incorporated into a chip, i.e., the network card 688 may be a full solution in a chip, and may not be a separate network card 688.

Referring to FIG. 5, it should be appreciated that the memory 130, touch screen display 606, the video port 638, the USB port 642, the camera 648, the first stereo speaker 654, the second stereo speaker 656, the microphone 660, the FM antenna 664, the stereo headphones 666, the RF switch 670, the RF antenna 672, the keypad 674, the mono headset 676, the vibrator 678, and the power supply 680 may be external to the on-chip system 102 or "off chip."

It should be appreciated that one or more of the method steps described herein may be stored in the memory as computer program instructions. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps or blocks described if such order or sequence does not alter the functionality of the invention. That is, it is recognized that some steps or blocks may performed before, after, or parallel (substantially simultaneously with) other steps or blocks without departing from the scope and spirit of the invention. In some instances, certain steps or blocks may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for operating a dynamic random access memory (DRAM) device in a personal computing device (PCD), the method comprising:
    providing a command decoder, a mode register block, and a multipurpose command (MPC) buffer in the DRAM in the DRAM device, all in communication with a decoder of the DRAM device;
    receiving information at the MPC buffer via a data (DQ) bus unique to the DRAM device, the information sent from outside the DRAM device;
    providing the received information from the MPC buffer to the decoder;
    determining with the decoder based on the received information whether to mask mode register writes (MRW) for the DRAM device;
    responsive to the determination, sending a mask signal from the decoder to the command decoder if the determination is to mask the MRW for the DRAM device;
    receiving a first MRW at the command decoder via a shared command access (CA) bus, the first MRW sent from outside the DRAM device; and
    responsive to an instruction from the decoder:
        if the instruction was to mask MRW, ignoring the first MRW at the command decoder, and
        if the instruction was to not mask MRW, forwarding the first MRW from the command decoder to the mode register block.

2. The method of claim 1, wherein the first DRAM device comprises a first die of a multi-die DRAM memory.

3. The method of claim 1, wherein the method further comprises:
    prior to receiving the information at the MPC buffer via the unique DQ bus, receiving a first command at the command decoder via the shared CA bus, the first command including enable information; and
    responsive to the received enable information, sending an enable signal to the decoder to cause the decoder to be become active.

4. The method of claim 3, wherein the enable information comprises an MRW received at the command decoder via the shared CA bus.

5. The method of claim 1, wherein the MPC buffer comprises a first-in-first-out (FIFO) buffer and the information received at the MPC buffer of the DRAM device comprises a MPC command.

6. The method of claim 5, wherein the MPC command includes a masking bit and the determination by the decoder is based on a setting of the masking bit.

7. The method of claim 1, wherein the decoder comprises a phase detector and the information received at the MPC buffer of the DRAM device comprises a DQS pulse.

8. The method of claim 7, wherein the determination by the decoder is based on a phase of the DQS pulse.

9. The method of claim 1, wherein sending the mask signal from the decoder to the command decoder further includes instructing the command decoder to mask only the first MRW.

10. The method of claim 1, wherein sending the mask signal from the decoder to the command decoder further includes instructing the command decoder to mask MRW until a second mask signal is received at the command decoder.

11. A dynamic random access memory (DRAM) device computer system for use in a computing device (PCD), the DRAM device comprising:
    a command decoder coupled to a shared command access (CA) bus;
    a mode register block in communication with the command decoder;
    a multipurpose command (MPC) buffer coupled to a data (DQ) bus unique to the DRAM device; and
    a decoder in communication with the command decoder, mode register block, and MPC buffer,
    wherein the MPC buffer is configured to receive information from outside the DRAM device over the unique DQ bus and provide the received information to the decoder, the decoder is configured to determine based on the received information whether to mask mode register writes (MRW) for the DRAM device and responsive to the determination send a mask signal to the command decoder if the determination is to mask the MIRW for the DRAM device, and the command decoder is configured to receive from outside the DRAM device a first MRW via the shared CA bus, and responsive to an instruction from the decoder:
  if the instruction was to mask MRW, ignore the first MRW, and
  if the instruction was to not mask MRW, forward the first MRW to the mode register block.

12. The system of claim 1, wherein the first DRAM device comprises a first die of a multi-die DRAM memory.

13. The system of claim 12, wherein the command decoder is further configured to:
  receive a first command via the shared CA bus prior to the information being received at the MPC buffer via the unique DQ bus, the first command including enable information, and
  responsive to the received enable information, send an enable signal to the decoder to cause the decoder to become active.

14. The system of claim 13, wherein the first command comprises a MRW and the enable information comprises an enable bit of the MRW.

15. The system of claim 11, wherein the MPC buffer comprises a first-in-first-out (FIFO) buffer and the information received at the MPC buffer of the DRAM device comprises a MPC command.

16. The system of claim 15, wherein the MPC command includes a masking bit and the determination by the decoder is based on a setting of the masking bit.

17. The system of claim 11, wherein the decoder comprises a phase detector and the information received at the MPC buffer of the DRAM device comprises a DQS pulse.

18. The system of claim 17, wherein the determination by the decoder is based on a phase of the DQS pulse.

19. The system of claim 11, wherein the mask signal from the decoder to the command decoder includes an instruction to mask only the first MRW.

20. The system of claim 11, wherein the mask signal from the decoder to the command decoder includes an instruction to mask MRW until a second mask signal is received at the command decoder.

21. A computer program product comprising a non-transitory computer usable medium having a computer readable program code embodied therein, said computer readable program code adapted to be executed to implement a method for operating a dynamic random access memory (DRAM) device in a personal computing device (PCD), the method comprising:
  providing a command decoder, a mode register block, and a multipurpose command (MPC) buffer in the DRAM in the DRAM device, all in communication with a decoder of the DRAM device;
  receiving information at the MPC buffer via a data (DQ) bus unique to the DRAM device, the information sent from outside the DRAM device;
  providing the received information from the MPC buffer to the decoder;
  determining with the decoder based on the received information whether to mask mode register writes (MRW) for the DRAM device;
  responsive to the determination, sending a mask signal from the decoder to the command decoder if the determination is to mask the MRW for the DRAM device;
  receiving a first MRW at the command decoder via a shared command access (CA) bus, the first MRW sent from outside the DRAM device; and
  responsive to an instruction from the decoder:
    if the instruction was to mask MRW, ignoring the first MRW at the command decoder, and
    if the instruction was to not mask MRW, forwarding the first MRW from the command decoder to the mode register block.

22. The computer program product of claim 21, wherein the first DRAM device comprises a first die of a multi-die DRAM memory.

23. The computer program product of claim 21, wherein the method further comprises:
  prior to receiving the information at the MPC buffer via the unique DQ bus, receiving a first command at the command decoder via the shared CA bus, the first command including enable information; and
  responsive to the received enable information, sending an enable signal to the decoder to cause the decoder to be become active.

24. The computer program product of claim 23, wherein the first command comprises a MRW and the enable information comprises an enable bit of the MRW.

25. The computer program product of claim 21, wherein the MPC buffer comprises a first-in-first-out (FIFO) buffer and the information received at the MPC buffer of the DRAM device comprises a MPC command.

26. A computer system for operating dynamic random access memory (DRAM) in a personal computing device (PCD), the system comprising:
  providing a command decoder, a mode register block, and a multipurpose command (MPC) buffer in the DRAM in the DRAM device, all in communication with a decoder of the DRAM device;
  means for receiving information at the MPC buffer via a data (DQ) bus unique to the DRAM device, the information sent from outside the DRAM device;
  means for providing the received information from the MPC buffer to the decoder;
  means for determining based on the received information whether to mask mode register writes (MRW) for the DRAM device;
  responsive to the determination, means for sending a mask signal from the decoder to the command decoder if the determination is to mask the MRW for the DRAM device;
  means for receiving a first MRW at the command decoder via a shared command access (CA) bus, the first MRW sent from outside the DRAM device; and
  responsive to an instruction from the decoder:
    if the instruction was to mask MRW, means for ignoring the first MRW at the command decoder, and
    if the instruction was to not mask MRW, means for forwarding the first MRW from the command decoder to the mode register block.

27. The system of claim 26, wherein the first DRAM device comprises a first die of a multi-die DRAM memory.

28. The system of claim 26, further comprising:
  means for receiving a first command at the command decoder via the shared CA bus prior to receiving the information at the MPC buffer via the unique DQ bus, the first command including enable information; and
  responsive to the received enable information, means for sending an enable signal to the decoder to cause the decoder to be become active.

29. The system of claim 28, wherein the first command comprises a MRW and the enable information comprises an enable bit of the MRW.

30. The system of claim 26, wherein the MPC buffer comprises a first-in-first-out (FIFO) buffer and the information received at the MPC buffer of the DRAM device comprises a MPC command.

\* \* \* \* \*